United States Patent
Colace et al.

(10) Patent No.: US 6,678,293 B2
(45) Date of Patent: Jan. 13, 2004

(54) WAVELENGTH SENSITIVE DEVICE FOR WAVELENGTH STABILIZATION

(75) Inventors: Lorenzo Colace, Rome (IT); Gianlorenzo Masini, Rome (IT)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/288,326

(22) Filed: Nov. 5, 2002

(65) Prior Publication Data

US 2003/0085441 A1 May 8, 2003

(30) Foreign Application Priority Data

Nov. 5, 2001 (EP) .............................................. 01309349

(51) Int. Cl.[7] .................................................. H01S 3/13
(52) U.S. Cl. ...................... 372/32; 372/29.02; 257/440
(58) Field of Search .............................. 372/32, 29.02, 372/38.1; 257/440

(56) References Cited

U.S. PATENT DOCUMENTS

| | | | |
|---|---|---|---|
| 5,130,776 A | | 7/1992 | Popovic et al. ............... 357/30 |
| 6,289,028 B1 | * | 9/2001 | Munks et al. .................. 372/20 |
| 6,385,217 B1 | * | 5/2002 | Singh et al. ................... 372/20 |
| 6,526,079 B1 | * | 2/2003 | Watterson et al. ............. 372/32 |
| 6,560,253 B1 | * | 5/2003 | Munks et al. .................. 372/32 |
| 2003/0085441 A1 | * | 5/2003 | Colace et al. ................ 257/440 |

FOREIGN PATENT DOCUMENTS

| | | |
|---|---|---|
| EP | 0 615 321 | 9/1994 |
| EP | 0 818 859 | 1/1998 |
| JP | 61115355 | 6/1986 |
| JP | 63014482 | 1/1988 |
| WO | WO 98/56045 | 12/1998 |

* cited by examiner

Primary Examiner—Leon Scott, Jr.

(57) ABSTRACT

A device for stabilizing the operating wavelength ($\lambda$) of an electro-optical component having a nominal operating wavelength ($\lambda_o$) by a wavelength influencing circuit adapted to be driven by a control signal. The device comprises a semiconductor photodiode adapted to be impinged upon by the radiation generated and/or processed by the component and to generate an output signal which is indicative of a difference of the wavelength of the radiation (($\lambda$) with respect to the nominal operating wavelength ($\lambda_o$, $\lambda_i$). The semiconductor photodiode includes a plurality of layers jointly defining two opposite diodes generating opposite photocurrents as a result of radiation impinging onto the photodiode. The opposite photocurrents are adapted to generate the control signal to effect the stabilization action.

19 Claims, 2 Drawing Sheets

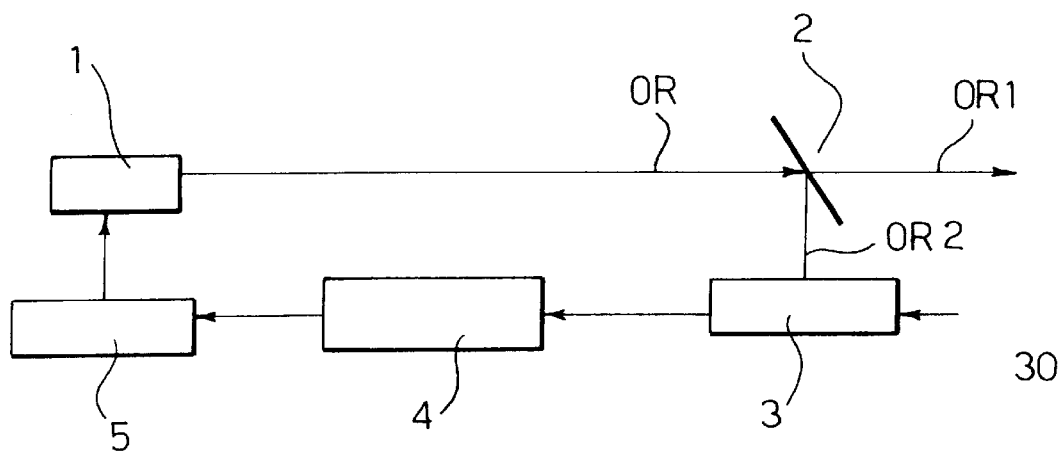
Fig_1
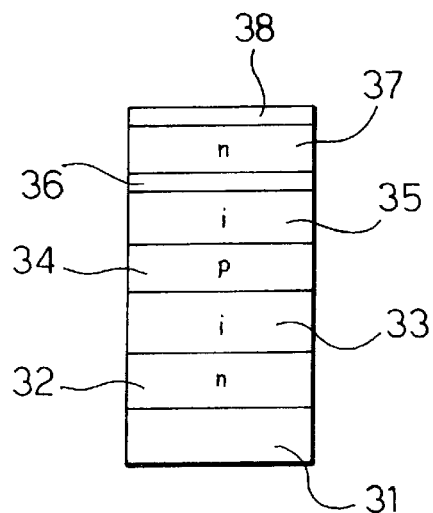
Fig_2
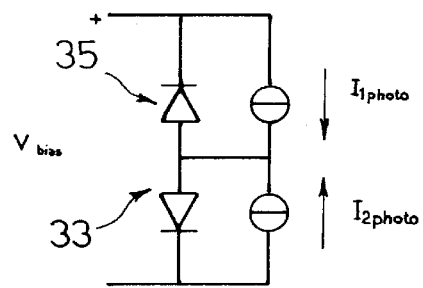
Fig_3

WAVELENGTH SENSITIVE DEVICE FOR WAVELENGTH STABILIZATION

FIELD OF THE INVENTION

The invention relates to wavelength control and stabilisation in tuneable devices such as lasers, filters and the like.

DISCUSSION OF THE BACKGROUND ART

Proper stabilisation of the operating wavelength over a range corresponding to several channels of a WDM (Wavelength Domain Multiplexing) system is an essential requirement for components intended to be used in WDM systems, especially of the "dense" type (DWDM).

Preferably, stabilisation must be independent of the source of perturbation, should be achieved at low cost and must be compatible with high level integration to give rise to laser sources of reduced dimensions.

A traditional arrangement resorted to for wavelength stabilisation of laser sources is based on gas spectral line absorption as a reference. While providing a high degree of accuracy, such a solution is not suitable for integration and is associated with inherently high costs.

Alternative solutions provide for the use of optical couplers and optical filters (see, for instance, U.S. Pat. No. 5,781,572), discrete photodiodes/filters with additional components (see for instance U.S. Pat. No. 5,825,792) and/or holographic/diffraction gratings. Other documents such as U.S. Pat. No. 6,134,253, U.S. Pat. No. 6,144,025 or U.S. Pat. No. 6,215,801 are of interest in the area of the invention.

A double diode consisting of a counter-polarised Si-Schottky diode and a SiGe PIN diode is known per se from WO-A-98/56045 where use for optical converters, logical switched networks as well as solar cells is contemplated.

Also, in European Application No. 01300426.6—which forms part of the prior art under the provisions of Art. 54(3) EPC—a device for monitoring the emission wavelength of a laser is disclosed including a wavelength selective filter exposed to the radiation emitted by the laser source. The device includes a semiconductor slice having first and second opposed surfaces. The first surface of the slice is exposed to the radiation at an angle to the main emission axis of the source such that a portion of the radiation impinges onto the first surface at angles in the vicinity of the Brewster angle. The radiation is thus refracted into the semiconductor slice towards the second surface of the slice, where the wavelength selective filter is arranged.

SUMMARY OF THE INVENTION

The object of the present invention is to provide a device for stabilising the operating wavelength of a component such as e.g. a laser or a tuneable filter which is further improved with respect to the prior art arrangements especially in terms of low manufacturing cost and high degree of integration.

According to the present invention that object is achieved by means of a device having the features set forth in the annexed claims.

Specifically, the arrangement of the invention provides for the use of a semiconductor photodiode adapted for use in combination with a processing block which controls the operating wavelength of an associated component by a proper mechanism. Exemplary of such a mechanism are i.e. controlling the junction temperature of a laser diode (for instance by means of a thermal condition device such as a Peltier cell), controlling the injection current into the proper sections of a Distributed Bragg Reflector (DBR) laser, inducing a mechanical stress in a component, varying the position of a mirror or the electrical field in an external cavity laser or a tuneable filter, etc. A wavelength conditioning action is therefore carried out by an actuator, which effectively counters any wavelength variation in the device.

Preferably, the photodiode is a double diode monolithically grown with a sequence of layers (n-i-p-i-n) corresponding to two opposed diodes.

The proposed device is able to discriminate wavelength variations in a selected spectral range as resulting from the choice of the materials included in the device structure.

The operating range can thus be adjusted in order to select the proper wavelength range and improve selectivity. This feature represents a major advance over prior art solutions such as disclosed e.g. in WO-A-98/56045 in that it provides an additional degree of freedom in bias voltage control for the definition of the zero output current wavelength. The proposed device is particularly suitable for use in the conventional and extended WDM bands (S, C, L).

The composition of the two active (i) layers is selected in such a way to provide two different photoresponses and thus two different photocurrents for any given wavelength of the laser diode. Since the photodiodes are opposed, the photocurrents subtract from each other.

Any change of the wavelength of the impinging radiation gives rise to a signal that can be processed to generate control signals for the actuator.

BRIEF DESCRIPTION OF THE DRAWINGS

The invention will now be described, by way of example only, with reference to the annexed drawings, wherein:

FIG. 1 is a block diagram of a system for wavelength stabilisation of laser according to the invention, FIG. 2 shows in greater detail the structure of the wavelength selective photodiode shown in FIG. 1, FIG. 3 is an equivalent circuit diagram of the component shown in FIG. 2, wherein current generators are illustrated accounting for the generated photocurrent.

In FIG. 1, reference numeral 1 designates a laser source such a laser diode whose emission wavelength is to be stabilised at a nominal given value $\lambda_0$ such as e.g. 1550 nm.

Figure 4:
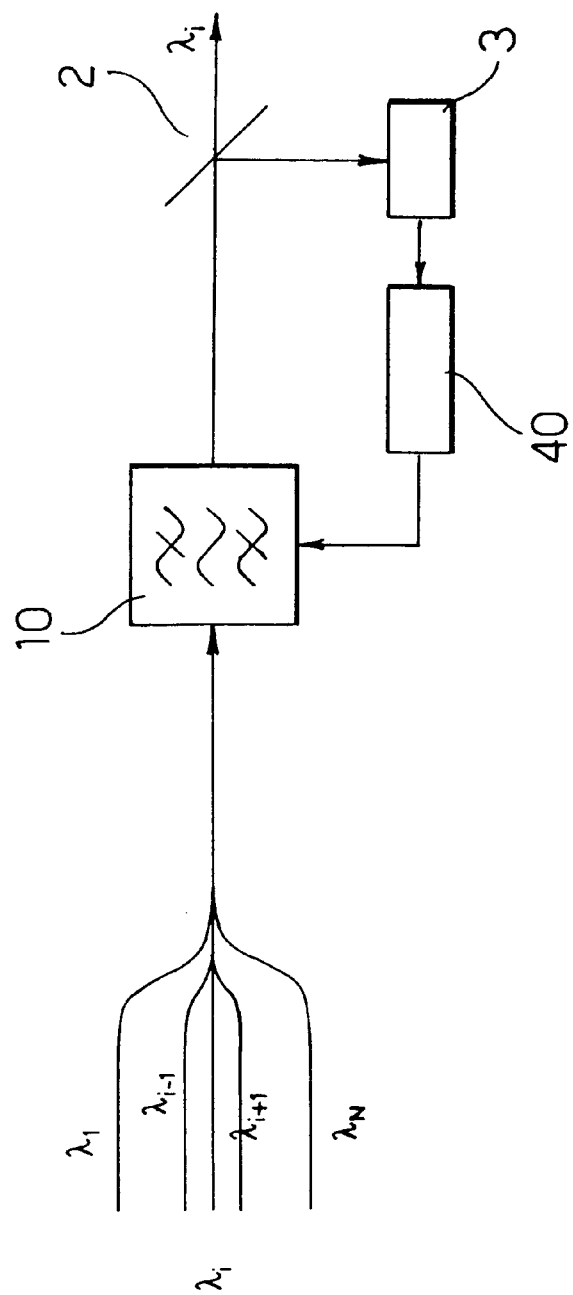
FIG. 4 shows the application of the invention to stabilisation of as tuneable filter.

The output radiation OR from laser source 1 is passed through a beam splitter 2 so that a main portion OR1 of the output radiation is further propagated towards a user device/system of any known type (e.g. an optical communication system). A further, minor portion OR2 of output radiation OR is split from beam OR and caused to impinge onto a wavelength sensitive device (WSD) comprised of an optoelectrical converter (photodiode) 3 to be better described in the following.

Photodiode 3 generates an output signal which provides an indication of the wavelength "error" of source 1, namely the difference between the actual wavelength $\lambda$ generated by source 1 and the nominal wavelength $\lambda_0$ (e.g. 1550 nm) of the radiation to be generated by source 1.

The error signal generated by photodiode 3 is fed to a processing circuit 4, which in turn controls a device 5 adapted to influence the emission wavelength of laser 1.

In one possible embodiment of the invention, device 5 is a thermal conditioning device (such as a Peltier cell) adapted to act on laser source 1 according to a general feedback arrangement in order to stabilise the emission wavelength of laser 1 at the nominal value $\lambda_0$. This can be accomplished e.g. by controlling the junction temperature in the case of a laser diode.

Alternative parameters adapted to be controlled to effect such a stabilising action by influencing the operating wavelength of a laser source are e.g. the temperature for a single section DFB laser, the currents in proper sections for a DBR laser, the external mirror reflectivity or position for an external cavity laser.

The general layout of the arrangement shown in FIG. 1 is conventional in the art, whereby additional details concerning the general structure and operation thereof need not be provided herein. Also, the persons skilled in the art will promptly appreciate that radiation OR2, which is caused to impinge onto photodiode 3 needs not necessarily be "split" from output radiation OR via e.g. beam splitter 2. Alternative arrangements are well known in the art wherein the radiation used to control the wavelength stabilisation loop is derived e.g. from the back facet of laser 1.

FIG. 2 shows in greater detail the structure of photodiode 3 that is essentially comprised of a double photodiode onto which radiation OR2 impinges and which generates the electrical signal to be processed (in a known manner) by processing unit 4. Photodiode 3 is polarised by means of a bias voltage supplied at a respective bias port 30.

In the preferred embodiment shown in FIG. 2, photodiode 3 is in the form of a double diode monolithically grown (by resorting to known opto-electronic technology) starting from an InP substrate 31 to include a sequence of layers comprising two opposite diodes.

Specifically, the sequence of layers in question includes:
a n layer 32,
an i (active) layer 33,
a p layer 34,
a further i (active) layer 35.

Preferably, the stacked arrangement of layers in question is completed (i.e. topped) by an InP spacer 36, a further n layer 37 and an InGaAs contact 38.

Stated otherwise, the stacked arrangement of layers just described includes, generally opposite to the basic substrate 31, a further n layer 37 and/or contact layer 38.

In the exemplary embodiment shown herein the composition of the two active i layers 33, 35 is of the InGaAsP and InGaAs type, respectively. This gives rise to two different photoresponses and thus two different photocurrents for any wavelength impinging onto photodiode 3. This is highlighted in FIG. 3 where the two photocurrents in questions are designated $I_{1photo}$ and $I_{2photo}$, respectively, while $V_{bias}$ designates the bias voltage applied at port 30 (FIG. 1).

Since the two photodiodes in question (briefly designated 33 and 35, respectively, in FIG. 3) are opposite, the respective photocurrents subtract from each other. The composition of layers 33 and 35 can thus be easily adjusted—by known means—in order to yield $I_{1photo}-I_{2photo}=0$ (i.e. a substantially zero current through photodiode 3) when the optical radiation impinging onto photodiode 3 corresponds to the wavelength $\lambda_0$ (e.g. 1550 nm), that is the nominal expected value of the emission wavelength of source 1.

Any change of the actual wavelength $\lambda$ emitted by laser 1 with respect to $\lambda_0$ results in an output signal (photocurrent) generated by photodiode 3 to be fed to processing unit 4 to control unit 5.

Tests carried out by the inventors using the arrangement shown in FIG. 1 and resorting to a Peltier cell to control the junction temperature of a DFB laser have demonstrated wavelength stabilisation within 50 pm (i.e. $10^{-12}$ m, which is about 6 GHz in the frequency domain) for a system where the control loop was driven by wavelength sensitive photodiode 3 only. Stability values within 0.5 pm (about 60 MHz) appear feasible by optimising both the device and the control loop and by minimising noise effects by appropriate circuit configuration.

The arrangement of the invention is suitable for high-level circuit integration, including mounting units 3 to 5 (totally or partly) directly onto laser source 1.

Sensitivity of the "zero current" working point with respect to bias voltage was demonstrated to be below 0.3 nm/mV. Values as low as 0.025 nm/mV appear feasible by geometry optimisation and passivation.

FIG. 4 shows a block diagram of a system where the device to be wavelength-stabilised is a tuneable bandpass filter 10 used in a WDM (Wavelength Domain Multiplexing) system.

A WDM signal, consisting of a plurality of signals at different, properly spaced wavelengths $\lambda_1, \ldots, \lambda_{i-1}, \lambda_i, \lambda_{i+1}, \ldots, \lambda_N$ is filtered by tuneable filter 10 which is roughly centred around an operative wavelength (i.e. $\lambda_i$). The filtered signal is split at a splitter designated 2 and a major portion of the output radiation is further propagated towards a user device/system of any known type (e.g. an optical communication system).

The minor portion of the filtered radiation split at splitter 2 impinges onto wavelength sensitive device 3. This is designed and biased in order to have a zero-current wavelength corresponding to $\lambda_i$. If the filter is not exactly tuned at $\lambda_i$, some signal from one of the adjacent wavelengths impinges onto device 3 generating a current. The current signal so generated provides an indication of the wavelength "error" (i.e. de-tuning) of filter 10, namely the difference between the actual central wavelength of the bandpass filter and the wavelength $\lambda_i$ to be filtered.

The error signal generated at device 3 is fed to a processing circuit 40 (of an analogue type or microprocessor-based) including a filter conditioning device of any known type adapted to act according to a general feedback arrangement in order to stabilise the tuneable filter central wavelength at the nominal value $\lambda_i$.

It will be appreciated that the "error" current signal exhibits opposite values depending on whether filter 10 is de-tuned to a higher or lower wavelength with respect to the reference, nominal wavelength $\lambda_i$.

Tuning of filter 10 by the filter conditioning device associated with circuit 40 takes place (in a manner known per se, e.g. from current tuneable filter technology) by resorting to thermal properties, by means of an external electrical field or by mechanical means.

Alloy compositions different from those specifically disclosed in the foregoing may be used with similar optical properties adapted to cover the same wavelength range. For instance, an AlInGaAs alloy could be used as an alternative to InGaAsP for applications in the 1550 nm WDM range. Also different material compositions, such as antimonide-based alloys, may be adopted for the sensing element e.g. in order to extend the application range to longer wavelengths, for instance when a precise laser wavelength in the near infrared (2000 nm and above) is required e.g. for gas tracking in so-called harsh environments (high temperature). In general terms, the materials comprising the plurality of layers in photodiode 3 are selected so that opposite photocurrents $I_{1photo}$, $I_{2photo}$ are generated as a result of photodiode 3 being impinged upon by a radiation having a given wavelength in a range corresponding (i.e. around and/or in the vicinity) of the nominal operating wavelength $\lambda_0$; $\lambda_i$.

It is thus evident that, the basic principles of the invention remaining the same, details and embodiments may widely vary with respect to what has been described and illustrated purely by way of example, without departing from the scope of the present invention as defined in the annexed claims.

What is claimed is:

1. A device for stabilizing the wavelength of an optical radiation in a component having a nominal operating wavelength by means of a wavelength influencing circuit adapted to be driven by a control signal, wherein said device comprises a semiconductor photodiode adapted to be impinged upon by said radiation to generate an output signal which is indicative of a difference of the wavelength of said radiation with respect to said nominal wavelength, wherein said semiconductor photodiode includes a plurality of layers jointly defining two diodes generating opposite photocurrents as a result of said radiation impinging onto said photodiode, said opposite photocurrents being adapted to generate said control signal.

2. The device of claim 1, wherein said opposite diodes are arranged to give opposite photocurrents substantially identical in intensity to yield a substantially zero output signal when said radiation impinging onto said photodiode is at said nominal operating wavelength.

3. The device of claim 1 or claim 2, wherein said layers of said photodiode include two active layers each defining a respective one of said opposite diodes.

4. The device of claim 3, wherein said active layers are of the InGaAsP and InGaAs types, respectively.

5. The device of claim 1, wherein the materials comprising said plurality of layers are selected so that said opposite photocurrents are generated as a result of said photodiode being impinged upon by a radiation having a given wavelength in a range corresponding to said nominal operating wavelength.

6. The device of claim 1, wherein said layers are monolithically grown on a common substrate.

7. The device of claim 6, wherein said substrate is an InP substrate.

8. The device of claim 6, wherein said plurality of layers includes, opposite to said substrate, a further n layer.

9. The device of claim 6, wherein said plurality of layers includes, opposite to said substrate, a contact layer.

10. The device of claim 9, wherein said contact layer is an InGaAs contact layer.

11. The device of claim 1, wherein said plurality of layers include the sequence of an n layer a first active layer, a p layer and a second active layer, wherein each of said active layers defines a respective one of said opposite diodes.

12. The device of claim 11, wherein said sequence of layers is grown on said substrate.

13. The device of claim 11, wherein said sequence of layers is topped by an InP spacer layer.

14. The device of claim 1, wherein said component is a laser source having a nominal emission wavelength as said nominal operating wavelength.

15. The device of claim 14, wherein said component is a gas sensing laser source having a nominal emission wavelength in the near infrared as said nominal operating wavelength.

16. The device of claim 1, wherein said wavelength influencing circuit includes at least one device selected from the group consisting of a thermal conditioning device, such as a Peltier cell, a device for controlling the junction temperature of a laser diode, a device for controlling the temperature for a single section DFB laser, a device for controlling the currents in proper sections of a DBR laser, a device for controlling the external mirror reflectivity or position for an external cavity laser.

17. The device of claim 1, wherein said component is a tuneable bandpass filter centered around a nominal filtering wavelength, wherein said nominal filtering wavelength constitutes said nominal operating wavelength.

18. The device of claim 17, wherein said wavelength influencing circuit includes at least one device adapted to vary said nominal filtering wavelength by resorting to thermal properties, by means of an external electrical field or by mechanical means.

19. The device of claim 1, wherein said device is integrated on a common substrate with said component and said wavelength influencing circuit.

* * * * *